US012730836B2

(12) United States Patent
Vartakavi et al.

(10) Patent No.: US 12,730,836 B2
(45) **Date of Patent: *Sep. 8, 2026**

(54) METHOD AND SYSTEM FOR GENERATING PODCAST METADATA TO FACILITATE SEARCHING AND RECOMMENDATION

(71) Applicant: Gracenote, Inc., New York, NY (US)

(72) Inventors: Aneesh Vartakavi, Emeryville, CA (US); Casper Lützhøft Christensen, Emeryville, CA (US)

(73) Assignee: Gracenote, Inc., New York, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 19/191,447

(22) Filed: Apr. 28, 2025

(65) Prior Publication Data

US 2025/0258858 A1 Aug. 14, 2025

Related U.S. Application Data

(63) Continuation of application No. 18/649,360, filed on Apr. 29, 2024, now Pat. No. 12,306,864, which is a (Continued)

(51) Int. Cl.
*G06F 16/30* (2019.01)
*G06F 16/335* (2019.01)
(Continued)

(52) U.S. Cl.
CPC .......... *G06F 16/383* (2019.01); *G06F 16/335* (2019.01); *G06F 16/35* (2019.01); *G06F 16/685* (2019.01); *G06F 16/7844* (2019.01); *G06F 30/27* (2020.01); *G06F 40/00* (2020.01); *G10L 15/00* (2013.01)

(58) Field of Classification Search
CPC ...... G06F 16/335; G06F 16/35; G06F 16/383; G06F 16/68; G06F 16/685; G06F 16/7844; G06F 30/27; G06F 40/00; G10L 15/00
See application file for complete search history.

(56) References Cited

U.S. PATENT DOCUMENTS

| | | | |
|---|---|---|---|
| 11,334,618 B1 * | 5/2022 | Adlersberg | G06F 3/0488 |
| 2017/0169816 A1 * | 6/2017 | Blandin | G06F 16/683 |

(Continued)

*Primary Examiner* — Diedra McQuitery
(74) *Attorney, Agent, or Firm* — McDonnell Boehnen Hulbert & Berghoff LLP

(57) ABSTRACT

A method and system for computer-based generation of podcast metadata, to facilitate operations such as searching for and recommending podcasts based on the generated metadata. In an example method, a computing system obtains a text representation of a podcast episode and obtains person data defining a list of person names such as celebrity names. The computing system then correlates the person data with the text representation, to find a match between a listed person name a text string in the text representation. Further, the computing system predicts a named-entity span in the text representation and determines that the predicted named-entity span matches a location of the text string in the text representation of the podcast episode, and based on this determination, the computing system generates and outputs metadata that associates the person name with the podcast episode.

20 Claims, 2 Drawing Sheets

Related U.S. Application Data continuation of application No. 18/194,260, filed on Mar. 31, 2023, now Pat. No. 12,001,472.

(60) Provisional application No. 63/326,457, filed on Apr. 1, 2022.

(51) Int. Cl.

| | |
|---|---|
| ***G06F 16/35*** | (2019.01) |
| ***G06F 16/383*** | (2019.01) |
| ***G06F 16/683*** | (2019.01) |
| *G06F 16/783* | (2019.01) |
| *G06F 30/27* | (2020.01) |
| *G06F 40/00* | (2020.01) |
| *G10L 15/00* | (2013.01) |

(56) References Cited

U.S. PATENT DOCUMENTS

| | | | | |
|---|---|---|---|---|
| 2019/0327524 | A1* | 10/2019 | Milavsky | G10L 15/22 |
| 2021/0326421 | A1* | 10/2021 | Khoury | G06F 21/32 |
| 2022/0115029 | A1* | 4/2022 | Garg | G10L 17/06 |

* cited by examiner

METHOD AND SYSTEM FOR GENERATING PODCAST METADATA TO FACILITATE SEARCHING AND RECOMMENDATION

REFERENCE TO RELATED APPLICATIONS

This is a continuation of U.S. patent application Ser. No. 18/649,360, filed Apr. 29, 2024, which is a continuation of U.S. patent application Ser. No. 18/194,260, filed Mar. 31, 2023, which claims priority to U.S. Provisional Patent Application No. 63/326,457, filed Apr. 1, 2022, the entirety of each of which is hereby incorporated by reference.

USAGE AND TERMINOLOGY

In this disclosure, unless otherwise specified and/or unless the particular context clearly dictates otherwise, the terms "a" or "an" mean at least one, and the term "the" means the at least one.

SUMMARY

Many podcasts lack structured, high-quality metadata that describes the podcast series and episodes.

To facilitate searching and recommendation, however, it would be useful to establish such metadata. For instance, it would be useful to establish podcast metadata that indicates one more podcast attributes such as information about people who are featured in a podcast or otherwise appear in a podcast and/or a description of the subject matter of a podcast, among other possibilities.

For example, metadata that indicates the people who are featured in various podcasts could be searched as a basis to find and recommend podcasts in which a given person was a guest. Similarly, metadata that indicates the people who are hosts of various podcasts could be searched as a basis to find and recommend podcasts in which a given person was the host. Likewise, metadata that indicates the subject matter of various podcasts could be searched as a basis to find and recommend podcasts that have addressed a given subject matter.

Further, cross-modal linking may facilitate using certain metadata as a basis to find podcasts of interest. For instance, given knowledge that certain people are members of the band Iron Maiden, metadata indicating that those people were guests on various podcasts could be searched as a basis to find and recommend podcasts related to the band Iron Maiden. Likewise, given knowledge of people who were cast members of the latest Quentin Tarantino movie, metadata indicating that those people were guests on various podcasts could be searched as a basis to find and recommend podcasts related to that latest Quentin Tarantino movie.

Unfortunately, however, it would be technically challenging to manually develop such metadata. In particular, doing so manually would be very time consuming and impractical to scale up with respect to potentially thousands or millions of podcast episodes.

Disclosed herein is a technical mechanism to help develop such metadata, possibly as a basis to tag podcasts with the metadata and/or as a basis to otherwise store the metadata, to facilitate searching, recommendation, and/or other operations based on the metadata.

In one respect, disclosed is a method. The method includes a computing system obtaining a text representation of a podcast episode and obtaining person data defining a list of person names such as celebrity names. The computing system then correlates the person data with the text representation, to find a match between a listed person name a text string in the text representation. Further, the computing system predicts a named-entity span in the text representation and determines that the predicted named-entity span matches a location of the text string in the text representation of the podcast episode, and based on this determination, the computing system generates and outputs metadata that associates the person name with the podcast episode.

In another respect, disclosed is a computing system configured to carry out such operations. Further, in another respect, disclosed is a non-transitory computer-readable storing program instructions executable by one or more processors to cause performance of such operations.

These as well as other aspects, advantages, and alternatives, will become apparent to those of ordinary skill in the art by reading the following detailed description, with reference where appropriate to the accompanying drawings. Further, it should be understood that the disclosure provided in this summary elsewhere in this document is provided by way of example only and that numerous variations and other examples may be possible as well.

DETAILED DESCRIPTION

I. Example Architecture

A. Computing Device

Figure 1:
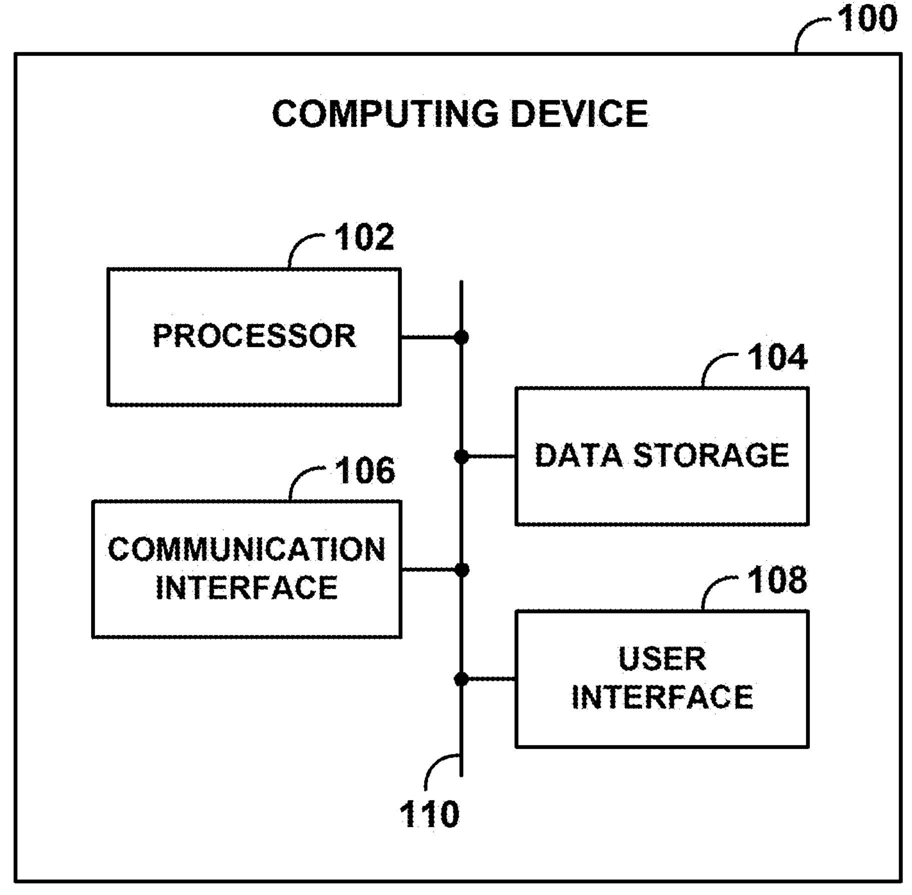
FIG. 1 is simplified block diagram of an example computing device operable in or as a computing system in accordance with the disclosure.

FIG. 1 is a simplified block diagram of an example computing device 100. The computing device 100 can be configured to perform and/or can perform one or more acts and/or functions, such as those described in this disclosure. The computing device 100 can include various components, such as a processor 102, data storage 104, a communication interface 106, and/or a user interface 108. Each of these components can be connected to each other via a connection mechanism 110.

In this disclosure, the term "connection mechanism" means a mechanism that facilitates communication between two or more components, devices, systems, or other entities. A connection mechanism can be a relatively simple mechanism, such as a cable or system bus, or a relatively complex mechanism, such as a packet-based communication network (e.g., the Internet). In some instances, a connection mechanism can include a non-tangible medium (e.g., in the case where the connection is wireless).

The processor 102 can include one or more general-purpose processors (e.g., a microprocessor) and/or one or more special-purpose processors (e.g., a digital signal processor (DSP)). The processor 102 can execute program instructions included in the data storage 104 as discussed below.

The data storage 104 can include one or more volatile, non-volatile, removable, and/or non-removable storage components, such as magnetic, optical, and/or flash storage, and/or can be integrated in whole or in part with the processor 102. Further, the data storage 104 can take the form of a non-transitory computer-readable storage medium, having stored thereon program instructions (e.g., compiled or non-compiled program logic and/or machine code) that, upon execution by the processor 102, cause the computing device 100 to perform one or more acts and/or functions, such as those described in this disclosure. These program instructions can define, and/or be part of, a discrete software application. In some instances, the computing device 100 can execute program instructions in response to receiving an input, such as an input received via the communication interface 106 and/or the user interface 108. The data storage 104 can also store other types of data, such as those types described in this disclosure.

The communication interface 106 can allow the computing device 100 to connect with and/or communicate with another entity according to one or more protocols. In one example, the communication interface 106 can be a wired interface, such as an Ethernet interface. In another example, the communication interface 106 can be a wireless interface, such as a cellular or WI-FI interface. In this disclosure, a connection can be a direct connection or an indirect connection, the latter being a connection that passes through and/or traverses one or more entities, such as a router, switcher, or other network device. Likewise, in this disclosure, a transmission can be a direct transmission or an indirect transmission.

The user interface 108 can include hardware and/or software components that facilitate interaction between the computing device 100 and a user of the computing device 100, if applicable. As such, the user interface 108 can include input components such as a keyboard, a keypad, a mouse, a touch-sensitive panel, and/or a microphone, and/or output components such as a display device (which, for example, can be combined with a touch-sensitive panel), a sound speaker, and/or a haptic feedback system.

B. Computing System

Each of the systems, devices, or other entities described in this disclosure can be implemented as a computing system. In this disclosure, the term "computing system" means a system that includes at least one computing device. In some instances, a computing system can include one or more other computing systems.

II. Example Operations

A computing system can perform various acts and/or functions. In an example implementation, for instance, the computing system could operate to detect presence in particular podcast episodes of particular people and to establish metadata that indicates the presence of those particular people in those particular podcast episodes, to facilitate searching and recommendation of podcast content based on the presence of those particular people in those particular podcast episodes.

A. Obtaining and Preprocessing of Podcast Data

To facilitate generating this or other metadata regarding podcast episodes, the computing system may first obtain or otherwise be provisioned with audio recordings and text representations of podcast episodes (or podcasts generally) and may engage in preprocessing to help facilitate further processing. Audio recordings of podcast episodes may comprise audio data files containing the podcast audio. Text representations of podcast episodes may comprise text files containing a text that is a transcription of speech in the podcast episodes and/or text that is a description of the podcast episodes, among other possibilities.

The computing system may obtain audio recordings of podcast episodes in various ways, such as through arrangements with podcasts providers and/or by automatically ingesting archival copies of the podcast content from online sources where appropriate, for instance. Further, the computing system may obtain text representations of podcast episodes in a similar manner and/or by applying speech recognition to the audio recordings to obtain transcripts of podcast episodes, among other possibilities.

The computing system can further preprocess text representations of podcasts to remove extraneous text, such as text that would likely not be relevant in searches for podcast content for instance. By way of example, the computing system can preprocess text representations of podcast episodes by searching for and removing from the text representations sentences that the computing system deems to provide certain irrelevant information, such as information about who sponsors the podcast episodes, perhaps sentences having a structure such as "This episode is brought to you by . . . " or the like.

In some examples, the computing system can use a text classifier to perform this or other such operations on the text representations of the podcasts. Without limitation, such a text classifier could be a machine-learning model trained with sentence structures labeled as being relevant or irrelevant. Once trained, the text classifier may receive as input the text representations of various podcast episodes and may evaluate each sentence in the text representations to determine a probability that the sentence is relevant, based on the earlier training, and the computing system may then establish a binary prediction of that probability. Further, the computing system may remove from text representations or flag as irrelevant any sentences that the computing system thereby deems to be irrelevant, so as to then filter out those irrelevant sentences from further processing.

B. Obtaining and Preprocessing of Person Data

As noted above, the computing system could operate to detect presence in particular podcast episodes of particular people and to establish associated metadata, which may facilitate searching and recommendation of podcast content based on the presence of those particular people. Without limitation, the remainder of this description will focus on an implementation where the people at issue are celebrities or people deemed to be celebrities. It will be understood, however, that the disclosed principles could apply as well with respect to other people and, for that matter, with respect to other podcast content.

In some examples, the computing system can generate or otherwise obtain or be provisioned with celebrity data that lists celebrities such as celebrity names and possibly associated data, for use in evaluating podcast episodes and establishing podcast metadata. For instance, the computing system may generate this celebrity data by ingesting the data from various sources, such as databases and/or websites that list cast members and production crew of movies, television shows, or theatrical productions, rosters of sports teams and associated management, names of politicians, and so forth. Further, the computing system may compile this celebrity data in a database structure, table, or the like, possibly correlating each celebrity's name with various descriptors of the celebrity, among other possibilities.

The computing system may also engage in preprocessing of this celebrity data, to help optimize the data for use in evaluating podcast episodes and establishing podcast metadata.

By way of example, the computing system could filter the list of celebrities to include just certain celebrities, so that the podcast evaluations could be focused on those certain celebrities. For instance, provided with a list of cast members in a movie or television show that lists the cast members in order from most famous to least famous, the computing system may include in the celebrity data just certain celebrities based on their being listed at the top of such a list and may omit from the celebrity data other celebrities based on their being listed lower in the list. Or provided with a list of celebrities that designates some as having one or more particular accreditations (e.g., memberships, awards etc.) and others as not having those accreditations, the computing system may include in the celebrity data just certain celebrities based on their having one or more such accreditations and may omit from the celebrity data other celebrities based on their not having one or more such accreditations. Likewise, the computing system may restrict the celebrity data to celebrities having other forms of fame, such as actors who have appeared in at least a minimum number of productions, and may thus omit other celebrities.

As another example, the computing system could filter the celebrity data to help manage situations where the data includes multiple listings of different names for the same celebrity or the like. For instance, where some celebrities have both a first name and a last name, and possibly a middle name, the celebrities may be listed both by the combination of their names and also just by their first name or just by their last name. (E.g., actor Christian Bale may be listed as both "Christian Bale" and "Christian.") To help address that situation, the computing system may apply a single-word name filter to omit from the celebrity data certain celebrity names that are just single-word celebrity names, such as just a first name, just a last name, or perhaps just a middle name.

Alternatively or additionally, the computing system may apply a primary-name filter, to help filter out of the celebrity data any celebrity names that are not primary celebrity names. To facilitate this, the computing system may have access to data that indicates for each of various celebrity names whether or not the name is a primary celebrity name. For instance, the celebrity data itself may tag each of its listed celebrity names with an indication of whether the listed name is a primary celebrity name. Such data may indicate, for instance, that the full name "Christian Bale" is the primary celebrity name and that the name "Christian" is not a primary celebrity name. Whereas, the data may indicate that the single-word celebrity name "Rhianna" is itself a primary celebrity name. And the data may indicate that the names "Elvis" and "Elvis Presley" are both primary celebrity names. Using this data, the computing system may evaluate the celebrity data to filter out any celebrity names that are not deemed to be primary celebrity names, which may help to refine the data so as to improve metadata generation.

These or other such filters may in some implementations function to remove single-word celebrity names from the celebrity data even for celebrities who go by single-word names, where such celebrities are also known by multi-word names. This may help to reduce the extent of false positives in evaluating podcast episodes. For instance, even though the celebrity "Dave Letterman" may go by both the name "Dave Letterman" and the name "Dave," the computing system may usefully filter out of the celebrity data the single-word name "Dave" in order to help reduce the extent of false positives where podcast episodes include mention of "Dave" for celebrities other than Dave Letterman. Likewise, as an alternative to the point mentioned above, even though the celebrity "Elvis Presley" is known as both "Elvis" and "Elvis Presley," the computing system may usefully filter out of the celebrity data the single-word name "Elvis" in order to help reduce the extent of false positives where podcast episodes include mention of "Elvis" for celebrities other than Elvis Presley.

The celebrity data may include for each of its listed celebrities a respective person identifier (ID). Further, in a scenario where the celebrity data lists more than one name for a given celebrity, the celebrity data may specify for each listed name the same person ID, in order to correlate the multiple names with the same celebrity. Alternatively, the celebrity data may otherwise correlate such names with each other.

C. Correlating of Person Data with Text Representations of Podcast Episodes

Given the text representations of podcast episodes and given the celebrity data listing celebrity names, the computing system could then engage in a process to determine which listed celebrities are relevant to which podcast episodes. In some examples, the computing system could do this by correlating the celebrity data with the text representations of podcast episodes, in order to identify particular podcast episodes whose text representations include text of particular celebrity names. The computing system could conduct this analysis with text matching using regular expressions derived from the list of celebrities, among other possibilities.

In an example of this correlation process, the computing system could refine, validate, and/or otherwise improve the text matching by using named-entity recognition (NER) and/or another process to determine what spans of text are named-entity text. NER, for instance, is a subtask of information extraction in natural language processing (NLP), which seeks to locate and classify named entities mentioned in unstructured text into predefined categories such as person names, for instance. A goal of NER may be to extract structured information from unstructured text data and to represent the extracted information in a machine-readable format.

The computing system could use an NER neural network to predict the span of each of various named entities within sentence of the text representations of podcast episodes. For instance, given the text representations of the podcast episodes as input, the NER neural network can predict that a particular text string within the text representation of a given podcast episode is a named-entity text string, and the computing system may output and store index data that specifies a span of that predicted named-entity text string in the podcast episode, effectively tagging the predicted named-entity in the podcast episode text. By way of example, the computing system could output and store start and end indexes such as character numbers that designate where the predicted named-entity text string is in the text representation of the podcast episode.

In this process, the computing system may avoid tagging just substring as a named entity when the computing system has identified an associated superstring as a named entity. For instance, given an NER-based prediction that the text representation of a podcast episode includes a person name as text "T. Chang" in a particular span, the computing system may tag that predicted person name, and the computing system may match the text "Chang" to the latter part of that person name. Because the computing system in that situation has identified a superstring or entire name "T. Chang" as a person, the computing system may then not tag the match "Chang" as a person name as well, since "Chang" is a substring rather than the entire name.

Use of NER or the like could help confirm or otherwise enhance text matching of celebrity names. For instance, the computing system could use pattern matching such as regular expression analysis to find what seem to be celebrity names in the text representations of podcast episodes, the computing system could also use NER or another such analysis to find named-entity text strings in the text representations of podcast episodes, and the computing system could correlate the results of these two analyses to help confirm that what the computing system found is a celebrity name rather than another term. (This type of analysis could help to confirm, for instance, that the term "Holly" as found in the text representation of a podcast episode is used as a person's name rather than as the name of an evergreen species.)

By way of example, the computing system could make a determination of whether the computing system both (i) finds through text matching that the celebrity name is present as a text string within the text representation of a podcast episode and also (ii) finds through NER or another analysis that a predicted named-entity span is present at the same place as the text string in the text representation of the podcast episode. If this determination is affirmative, then the computing system could conclude with relative certainty that the identified text string is the celebrity name, perhaps rather than being another term. Whereas, if this determination is negative, then the computing system may not draw that conclusion.

D. Identifying Roles

For podcast search and discovery, it may be desirable to search not only based on celebrity name but also based on the role of a named celebrity. For instance, it may be desirable to search for podcast episodes where a given celebrity was a podcast host, where a given celebrity was a podcast guest, and/or where a given celebrity was a podcast subject.

To facilitate this in some examples, the computing system could further engage in a process to predict the roles of various celebrities whose names the computing system determines to be present in the text representation of podcast episodes. For instance, the computing system could do so using machine-learning-based role-identification similar to the NER process noted above. By way of example, a machine-learning model could be trained using a training dataset that labels named entities in text representations of podcast episodes as "Person-Host", "Person-Guest", or "Person-Subject". Given the text representation of a podcast episode as input, possibly along with a prediction of a given text span being a celebrity name as discussed above, this machine-learning model may predict a role of that particular celebrity with respect to the podcast episode, such as whether the celebrity is a host of the podcast episode, a guest of the podcast episode, and/or a subject of the podcast episode, possibly outputting and storing binary indications as probabilities for each such role. Alternatively, the computing system may apply a combined process that outputs at once both a prediction of the span of a celebrity name in a given podcast episode and also a prediction of the role of that celebrity in the podcast episode.

Accordingly, given a sentence from a description, title, or transcript of a podcast episode, the role identification module can output a location of a probable named entity within the sentence, as well as binary indications or probabilities for each of the roles. The computing system can use the output of the role identification module to generate metadata that identifies a role of a celebrity in the podcast episode.

E. Using Voice Identification

In some examples, the computing system can use voice identification to generate further information about celebrities in relation to podcast episodes and/or as a basis to validate some of the findings discussed above.

To facilitate this, the computing system could be obtain or otherwise be provisioned with reference voice templates or voice fingerprints of various celebrities, enabling the computing system to engage in voice matching such voiceprint matching to detect a particular celebrity's voice in an audio recording. The computing system could thus apply voice matching to the received audio recordings of podcast episodes in order to detect in those podcast episodes the presence of voice of particular celebrities.

The computing system could use this voice identification process as basis to confirm the results of its text matching, such as to confirm that a given celebrity name is mentioned in a given podcast episode. For instance, if the computing system has determined through text matching that a given celebrity name is present in the text representation of the podcast episode, the computing system could also use voice identification to match audio of the podcast against one or more reference voice templates for that celebrity, to determine whether that celebrity's voice is present in the podcast episode Further, the computing system could engage in this process as a basis to control whether to establish metadata indicating that the celebrity is relevant to the podcast, such as that the celebrity is a host, guest, or subject of the podcast. For instance, if the computing system determines through the voice identification that the celebrity's voice is present in the podcast episode, then the computing system may generate such metadata or otherwise provide output indicating that the celebrity is relevant to the podcast. Whereas, if the computing system determines through the voice identification that the celebrity's voice is not present in the podcast episode, then the computing system may forgo generating such metadata or otherwise providing output indicating that the celebrity is relevant to the podcast.

Additionally or alternatively, the computing system could use the voice identification as a basis to identify times within a given podcast episode when a given celebrity is speaking. For instance, after identifying a given celebrity name in the text representation of a podcast episode, the computing system could use voice identification based on one or more reference voice templates for that celebrity, as a basis to determine one or more time points in the podcast episode when that particular celebrity is speaking. And the computing system could output and store data indicating those identified times as to that particular celebrity, such as with a start timestamp and end timestamp for each identified time.

F. Predicting Podcast Genre

In some examples, the computing system may also engage in a process to predict the genre respectively of each of various podcast episodes. For instance, the computing system could use a text classifier to analyze the text representation respectively of each podcast episode in order to classify the genre of the podcast episode, with a genre classification such as true crime, comedy, business, or news, among other possibilities. In some examples, the text classifier is a machine-learning based text classifier that receives sentences as input and outputs binary indications or probabilities for each of multiple possible genre classifications. Alternatively, the computing system may use audio analysis, such as speech analysis, also possibly machine-learning-based, as a basis to predict the genre of each of various podcast episodes.

G. Generating and Using of Metadata

Through the above example processes the computing system may therefore establish various useful metadata regarding podcast episodes in a manner that would be technically impractical to do manually, especially at scale including many thousands or millions of podcast episodes in some examples.

This metadata could include the results of the analyses discussed above. For instance, the metadata could include data per podcast episode that specifies one or more celebrities deemed to be relevant to the podcast episode, such as celebrities whose names the computing system determined to be present within the text representation of the podcast episode, possibly as confirmed by voice identification or through other processes. Further, for each such celebrity deemed to be relevant to the podcast episode, the metadata could include data specifying a role of the celebrity and data specifying times when that celebrity is speaking in the podcast episode. Other data and examples, in line with the discussion above for instance, could be possible as well.

In addition, the computing system may also establish metadata on a per celebrity basis, indicating podcast episodes as to which the computing system determined the celebrity to be relevant, possibly also with data such a podcast role and speaking times as well, among other possibilities.

The computing system could optimally provide this metadata in various forms and for various uses.

For example, as to metadata that the computing system establishes on a per podcast-episode basis, the computing system could output and store data, such as a database or other mapping data, that designates a correlation between the metadata and particular podcast episodes. The computing system may then use or make this data available for use as a basis to facilitate searching for and possible recommendations of podcasts based on celebrity names. Further, the computing system may provide this data separate from the podcast episodes and/or may store this data as metadata in or with the podcast episodes such as by steganographically encoding the data within the podcast audio and/or including transport-stream header data, among other possibilities.

Likewise, as to metadata that the computing system establishes on a per celebrity basis, the computing system could output and store data, such as a database or other mapping data, that designates a correlation between the metadata and a particular celebrity. The computing system may then likewise use or make this data available for use as a basis to facilitate searching for and possible recommendation of podcasts based on celebrity names and/or other actions.

With this and/or other such metadata, the computing system or another computing system may facilitate searching for podcasts based on celebrity names. For instance, the computing system may generate and provide a web-based graphical user interface accessible by end-users, through which end-users could search for podcasts based on celebrity names, and which the computing system would engage in searching and serving of search results based on the generated metadata. Or the computing system could provide the metadata to another computing to facilitate this or other such searching functionality and/or other actions.

Through such an interface, the computing system might receive a celebrity name entered by a user and might search the generated metadata to find podcast episodes as to which that celebrity was deemed relevant. For each such podcast episode that the computing system so finds, the computing system may then output for presentation to the user associated information such as the role of the celebrity in the podcast episode and one or more times when the celebrity is speaking in the podcast episode, as well as other information such as a title of the podcast episode, a genre of the podcast episode, and a link to the podcast episode, among other possibilities.

Further, the computing system may allow the user to use some of this information as a basis to tailor such a search. For instance the computing system may receive from the user not only a celebrity name but also a podcast genre, and the computing system may responsively search for podcast episodes that are of that genre and as to which that celebrity is deemed to be relevant and could provide the user with associated search results.

H. Example Process Flow and Associated Implementations

Figure 2:
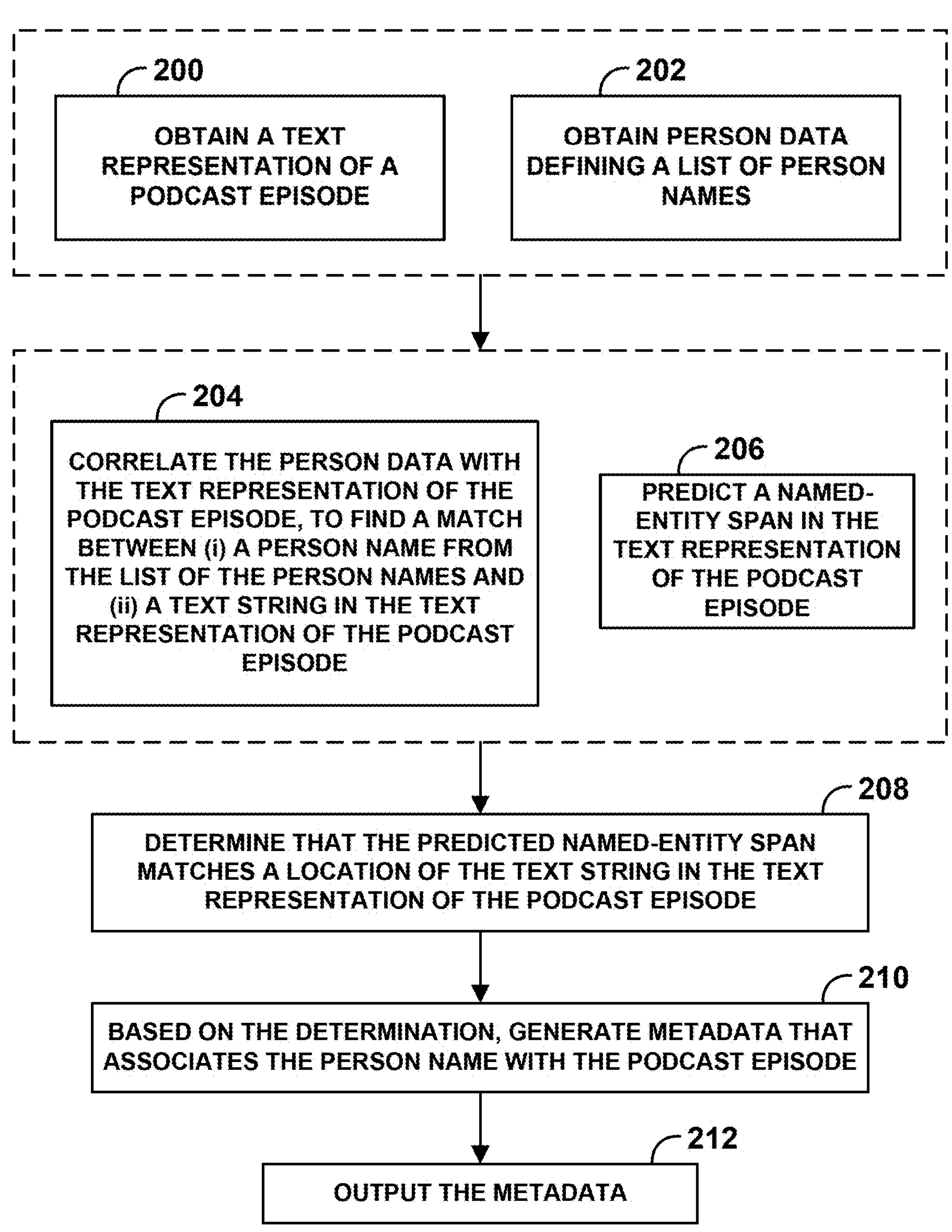
FIG. 2 is a flow chart illustrating an example method in accordance with the disclosure.

FIG. 2 is a flow chart illustrating an example method that could be carried out by a computing system in accordance with the present disclosure. As shown in FIG. 2, at block 200, the method includes a computing system obtaining a text representation of a podcast episode, and at block 202, the method includes the computing system obtaining person data defining a list of person names (e.g., celebrity names). The method then includes the computing system engaging in correlation and prediction operations. Namely, at block 204, the method includes the computing system correlating the person data with the text representation of the podcast episode, to find a match between (i) a person name from the list of the person names and (ii) a text string in the text representation of the podcast episode, such as to find a text string that matches a listed person name. And at block 206, the method includes the computing system predicting a named-entity span in the text representation of the podcast episode.

At block 208, the method then includes the computing system determining that the predicted named-entity span matches a location of the text string in the text representation of the podcast episode. And at block 210, the method includes, based on the determining that the predicted named-entity span matches the location of the text string in the text representation of the podcast episode, the computing system generating metadata that associates the person name with the podcast episode. At block 212, perhaps as part of the generating operation, the method then includes the computing system outputting the metadata, e.g., for internal use by the computing system or for use by one or more other systems.

In line with the discussion above, the person names in the list defined by the person data are names of people (e.g., celebrities), and the person name found to match the text string in the text representation could thus be the name of a given person.

As further discussed above, the method may additionally include filtering the person data based on accreditations of the people whose names are listed. Further, the method could additionally include the computing system (i) using machine-learning-based role identification to determine a role of the person in the podcast episode, (ii) based on the determined role of the person in the podcast episode, generating additional metadata that identifies the role of the person in the podcast episode, and (iii) outputting the generated additional metadata, perhaps as part of the other output metadata. In this process, for instance, the role might be a host of the podcast episode, a guest of the podcast episode, and/or a subject of the podcast episode.

As also discussed above, the method could additionally include the computing system making a voice-identification-based determination of whether a voice of the person is included in the podcast episode, in which case the act of generating of the metadata that associates the person name with the podcast episode could be further based on the voice-identification-based determination, such as by generating and outputting that metadata conditional on finding a voice of the person in the podcast episode for instance.

Alternatively or additionally, as discussed above, the method could further involve the computing system using voice identification as a basis to determine one or more times in the podcast episode when a voice of the person is present, and the computing system generating and outputting additional metadata (again possibly as part of the other output metadata) that indicates the one or more determined times.

Still further, as discussed above, the method could include using the generated metadata as a basis to facilitate podcast searching based on the person name. For instance, as indicated above, the computing system may provide a user interface through which to facilitate such searching and/or may provide the metadata for use by another system to facilitate such searching.

As noted above, this method could be carried out by a computing system such as that described above. Further, the present disclosure also contemplates at least one non-transitory computer readable medium (e.g., magnetic, optical, flash, RAM, ROM, EPROM, EEPROM, etc.) that is encoded with, embodies, or otherwise stores program instructions executable by at least one processor to carry out the operations of the method and/or other operations discussed herein.

III. Example Variations

Although some of the acts and/or functions described in this disclosure have been described as being performed by a particular entity, the acts and/or functions can be performed by any entity, such as those entities described in this disclosure. Further, although the acts and/or functions have been recited in a particular order, the acts and/or functions need not be performed in the order recited. However, in some instances, it can be desired to perform the acts and/or functions in the order recited. Further, each of the acts and/or functions can be performed responsive to one or more of the other acts and/or functions. Also, not all of the acts and/or functions need to be performed to achieve one or more of the benefits provided by this disclosure, and therefore not all of the acts and/or functions are required.

Although certain variations have been discussed in connection with one or more examples of this disclosure, these variations can also be applied to all of the other examples of this disclosure as well.

Although select examples of this disclosure have been described, alterations and permutations of these examples will be apparent to those of ordinary skill in the art. Other changes, substitutions, and/or alterations are also possible without departing from the true spirit and scope of the invention.

What is claimed is:

1. A method comprising:

obtaining, by a computing system provisioned with person data defining a list of person names, a text representation of a podcast episode and an audio representation of the podcast episode;

correlating, by the computing system, the person data with the text representation of the podcast episode to a person name from the list of the person names based on a text string within the text representation of the podcast episode;

matching, by the computing system in communication with a database storing a reference voice template for a voice corresponding to the person name, the audio representation of the podcast episode against the reference voice template, to detect presence in the podcast episode of the voice corresponding to the person name;

in response to detecting the voice corresponding to the person name in the podcast episode, generating, by the computing system, metadata to associate the person name with the podcast episode; and outputting, by the computing system, the generated metadata.

2. The method of claim 1, wherein the person names in the list defined by the person data are names of people, the method further comprising:

filtering, by the computing system, the person data based on accreditations of the people.

3. The method of claim 1, further comprising:

determining, by the computing system utilizing machine-learning-based role identification, a role of a person in the podcast episode; and based on the determined role of the person in the podcast episode, generating, by the computing system, additional metadata to identify the role of the person in the podcast episode, wherein outputting by the computing system the generated metadata further includes outputting by the computing system the additional metadata when generated.

4. The method of claim 3, wherein the role comprises at least one item selected from the group consisting of a host of the podcast episode, a guest of the podcast episode, and a subject of the podcast episode.

5. The method of claim 1, further comprising:

using, by the computing system, voice identification on at least a part of the audio representation as a basis to determine one or more times in the podcast episode when the voice corresponding to a person is present; and generating and outputting, by the computing system, additional metadata indicating the one or more determined times.

6. The method of claim 5, wherein in the additional metadata comprises, for each of the one or more identified times, a start timestamp and an end timestamp.

7. The method of claim 1, further comprising:

searching, based on the generated metadata, one or more the podcast episode for the person name.

8. A computing system comprising:

one or more processors;

non-transitory data storage; and program instructions stored in the non-transitory data storage and executable by the one or more processors to carry out operations including:

obtaining a text representation of a podcast episode and an audio representation of the podcast episode, obtaining person data defining a list of person names, correlating the person data with the text representation of the podcast episode to a person name from the list of the person names based on a text string within the text representation of the podcast episode, obtaining at least a reference voice template of a voice corresponding to a person name, matching the audio representation of the podcast episode against the reference voice template, to detect presence in the podcast episode of the voice corresponding to the person name, based at least on the detecting in the podcast episode of the voice of a person having the person name, generating metadata that associates the person name with the podcast episode, and outputting the generated metadata.

9. The computing system of claim 8, wherein the person names in the list defined by the person data are names of people, the method further comprising:

filtering the person data based on accreditations of the people.

10. The computing system of claim 8, wherein the operations additionally include:

determining using machine-learning-based role identification a role of the person in the podcast episode, and based on the determined role of the person in the podcast episode, generating additional metadata that identifies the role of the person in the podcast episode, wherein outputting the generated metadata includes outputting the generated additional metadata.

11. The computing system of claim 10, wherein the role comprises at least one item selected from the group consisting of a host of the podcast episode, a guest of the podcast episode, and a subject of the podcast episode.

12. The computing system of claim 8, wherein the operations additionally include:

using voice identification as a basis to determine one or more times in the podcast episode when the voice of the person is present; and generating and outputting additional metadata indicating the one or more determined times.

13. The computing system of claim 12, wherein the additional metadata comprises, for each of the one or more identified times, a start timestamp and an end timestamp.

14. The computing system of claim 8, wherein the operations additionally include:

searching, based on the generated metadata, one or more podcast episode for the person name.

15. A non-transitory computer-readable medium having stored thereon program instructions executable by one or more processors to cause performance of operations comprising:

obtaining a text representation of a podcast episode and an audio representation of the podcast episode, obtaining person data defining a list of person names, correlating the person data with the text representation of the podcast episode to a person name from the list of the person names based on a text string within the text representation of the podcast episode, obtaining at least a reference voice template of a voice corresponding to a person name, matching the audio representation of the podcast episode against the reference voice template, to detect presence in the podcast episode of the voice corresponding to the person name, based at least on the detecting in the podcast episode of the voice of a person having the person name, generating metadata that associates the person name with the podcast episode, and outputting the generated metadata.

16. The non-transitory computer-readable medium of claim 15, wherein the person names in the list defined by the person data are names of people, the operations further comprising:

filtering the person data based on accreditations of the people.

17. The non-transitory computer-readable medium of claim 15, wherein the operations further comprise:

determining using machine-learning-based role identification a role of the person in the podcast episode;

based on the determined role of the person in the podcast episode, generating additional metadata that identifies the role of the person in the podcast episode; and outputting the generated additional metadata.

18. The non-transitory computer-readable medium of claim 17, wherein the role comprises at least one item selected from the group consisting of a host of the podcast episode, a guest of the podcast episode, and a subject of the podcast episode.

19. The non-transitory computer-readable medium of claim 15, wherein the operations further comprise:

using voice identification as a basis to determine one or more times in the podcast episode when a voice of the person is present; and generating and outputting additional metadata indicating the one or more determined times.

20. The non-transitory computer-readable medium of claim 15, wherein the operations additionally comprise:

searching, based the generated metadata, one or more podcast episode for the person name.

* * * * *